United States Patent
Park et al.

(10) Patent No.: US 12,040,473 B2
(45) Date of Patent: Jul. 16, 2024

(54) POSITIVE ELECTRODE FOR SECONDARY BATTERY, METHOD FOR MANUFACTURING SAME, AND LITHIUM SECONDARY BATTERY INCLUDING SAME

(71) Applicant: LG Energy Solution, Ltd., Seoul (KR)

(72) Inventors: Sung Bin Park, Daejeon (KR); Dong Hun Lee, Daejeon (KR); Hyung Man Cho, Daejeon (KR); Jung Min Han, Daejeon (KR); Jin Tae Hwang, Daejeon (KR); Wang Mo Jung, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 443 days.

(21) Appl. No.: 17/311,914

(22) PCT Filed: Dec. 6, 2019

(86) PCT No.: PCT/KR2019/017228
§ 371 (c)(1),
(2) Date: Jun. 8, 2021

(87) PCT Pub. No.: WO2020/122511
PCT Pub. Date: Jun. 18, 2020

(65) Prior Publication Data
US 2022/0029145 A1  Jan. 27, 2022

(30) Foreign Application Priority Data

Dec. 10, 2018  (KR) .................. 10-2018-0158447
Dec. 5, 2019   (KR) .................. 10-2019-0160861

(51) Int. Cl.
*H01M 4/04*  (2006.01)
*C23C 16/40* (2006.01)
(Continued)

(52) U.S. Cl.
CPC ......... *H01M 4/0428* (2013.01); *C23C 16/403* (2013.01); *C23C 16/405* (2013.01);
(Continued)

(58) Field of Classification Search
None
See application file for complete search history.

(56) References Cited

U.S. PATENT DOCUMENTS

2016/0013476 A1  1/2016  Oh et al.
2016/0149220 A1  5/2016  Uhm et al.
(Continued)

FOREIGN PATENT DOCUMENTS

CN  102244231 A  11/2011
CN  102969498 A  3/2013
(Continued)

OTHER PUBLICATIONS

Machine Translation Chinese Patent Publication No. 108767212 (Year: 2018).*

(Continued)

*Primary Examiner* — Wyatt P McConnell
(74) *Attorney, Agent, or Firm* — Lerner David LLP (57) ABSTRACT

The present disclosure provides a method for manufacturing a positive electrode for a secondary battery, the method including forming a positive electrode mixture layer including a positive electrode active material on a positive electrode current collector, and forming a metal oxide coating layer on the positive electrode mixture layer by atomic layer deposition, wherein the positive electrode active material includes lithium composite transition metal oxide particles and a boron-containing coating layer formed on the lithium composite transition metal oxide particles, and the lithium composite transition metal oxide particles include nickel (Continued)

(Ni), cobalt (Co), and manganese (Mn), wherein the nickel (Ni) is 60 mol % or greater of all metals excluding lithium.

11 Claims, 2 Drawing Sheets

(51) Int. Cl.
    *H01M 4/131*     (2010.01)
    *H01M 4/1391*     (2010.01)
    *H01M 4/505*     (2010.01)
    *H01M 4/525*     (2010.01)
    *H01M 10/0525*     (2010.01)
    *C23C 16/455*     (2006.01)
    *H01M 4/02*     (2006.01)

(52) U.S. Cl.
    CPC ......... *H01M 4/0404* (2013.01); *H01M 4/131* (2013.01); *H01M 4/1391* (2013.01); *H01M 4/505* (2013.01); *H01M 4/525* (2013.01); *H01M 10/0525* (2013.01); *C23C 16/45525* (2013.01); *H01M 2004/021* (2013.01); *H01M 2004/028* (2013.01); *H01M 2220/20* (2013.01)

(56) References Cited

U.S. PATENT DOCUMENTS

| | | | |
|---|---|---|---|
| 2016/0172671 A1 | 6/2016 | Yoo et al. | |
| 2016/0172682 A1 | 6/2016 | Martin et al. | |
| 2016/0351973 A1* | 12/2016 | Albano | H01M 4/628 |
| 2017/0162855 A1 | 6/2017 | Kim et al. | |
| 2018/0183053 A1 | 6/2018 | Hori | |
| 2018/0351169 A1 | 12/2018 | Oh et al. | |
| 2019/0165360 A1 | 5/2019 | Saruwatari et al. | |
| 2019/0386287 A1 | 12/2019 | Kim et al. | |
| 2022/0029145 A1 | 1/2022 | Park et al. | |

FOREIGN PATENT DOCUMENTS

| | | |
|---|---|---|
| CN | 104781960 A | 7/2015 |
| CN | 106384838 A | 2/2017 |
| CN | 106960933 A | 7/2017 |
| CN | 107706351 A | 2/2018 |
| CN | 107910518 A | 4/2018 |
| CN | 108206278 A | 6/2018 |
| CN | 108767212 A | 11/2018 |
| JP | 201588343 A | 5/2015 |
| JP | 2015536558 A | 12/2015 |
| JP | 2016532280 A | 10/2016 |
| JP | 2022513765 A | 2/2022 |
| KR | 20090076277 A | 7/2009 |
| KR | 20130014245 A | 2/2013 |
| KR | 101274829 B1 | 6/2013 |
| KR | 101310556 B1 | 9/2013 |
| KR | 20150074744 A | 7/2015 |
| KR | 20160045029 A | 4/2016 |
| KR | 20160053849 A | 5/2016 |
| KR | 101628572 B1 | 6/2016 |
| KR | 20160073178 A | 6/2016 |
| KR | 101664537 B1 | 10/2016 |
| KR | 20170009557 A | 1/2017 |
| KR | 101722996 B1 | 4/2017 |
| KR | 20170063143 A | 6/2017 |
| KR | 20170075596 A | 7/2017 |
| KR | 101898240 B1 | 10/2018 |
| WO | 2017094163 A1 | 6/2017 |
| WO | 2017199891 A1 | 11/2017 |

OTHER PUBLICATIONS

"Emerging Applications for Atomic Layer Deposition in Li-Ion Battery Studies" by Meng et al., in Advanced Materials, 2012, 24, 3589-3615. (Year: 2012).*
International Search Report for Application No. PCT/KR2019/017228 dated Mar. 24, 2020, pp. 1-3.
Search Report for European Application No. 19896843.0 dated Dec. 7, 2021. 1 pg.
Search Report dated May 7, 2024 from Office Action for Chinese Application No. 201980080883.2 issued May 14, 2024. 3 pgs.

* cited by examiner

FIG. 1

FIG. 2

POSITIVE ELECTRODE FOR SECONDARY BATTERY, METHOD FOR MANUFACTURING SAME, AND LITHIUM SECONDARY BATTERY INCLUDING SAME

CROSS-REFERENCE TO RELATED APPLICATIONS

The present application is a national phase entry under 35 U.S.C. § 371 of International Application No. PCT/KR2019/017228 filed Dec. 6, 2019, which claims the benefit of Korean Patent Application Nos. 10-2018-0158447, filed on Dec. 10, 2018, and 10-2019-0160861, filed on Dec. 5, 2019, all of which are incorporated by reference herein in their entirety.

TECHNICAL FIELD

The present disclosure relates to a positive electrode for a secondary battery, a method for manufacturing the same, and a lithium secondary battery including the same.

BACKGROUND ART

Recently, the demand for a small and lightweight secondary battery having a relatively high capacity is rapidly increased due to the rapid spread of electronic devices using batteries, such as cell phones, notebook computers, electric vehicles, and the like. Particularly, a lithium secondary battery is lightweight and has a high energy density, and thus, is attracting attention as a driving power source for portable devices. Therefore, research and development efforts for improving the performance of a lithium secondary battery have been actively conducted.

A lithium secondary battery generates electric energy by an oxidation and reduction reaction when lithium ions are intercalated/de-intercalated from a positive electrode and a negative electrode when an organic electrolyte or a polymer electrolyte is charged between the positive electrode and the negative electrode made of active materials capable of intercalation and de-intercalation of lithium ions.

As a positive electrode active material of a lithium secondary battery, a lithium cobalt oxide ($LiCoO_2$) has been mainly used. In addition, the use of $LiMnO_2$ having a layered crystal structure, a lithium manganese oxide such as $LiMn_2O_4$ having a spinel-like crystal structure, and a lithium nickel oxide ($LiNiO_2$) is also being considered.

Recently, the use of a lithium composite transition metal oxide in a form in which a part of nickel is substituted with another transition metal such as manganese and cobalt has been proposed. In particular, a lithium composite transition metal oxide containing nickel in a high content has an advantage of being relatively excellent in capacity properties.

However, there is a problem in that the resistance of the high-nickel positive electrode active material described above is increased as charge/discharge is repeated, and thus, it is difficult to secure output properties required.

Korean Patent Laid-Open Publication No. 10-2016-0053849 discloses a positive electrode active material and a secondary battery including the same.

DETAILED DESCRIPTION OF THE PRESENT DISCLOSURE

Technical Problem

An aspect of the present disclosure provides a method for manufacturing a positive electrode for a secondary battery, the positive electrode effectively reducing the degree of resistance increase caused by charge/discharge and having excellent output properties.

Another aspect of the present disclosure provides a method for manufacturing a positive electrode for a secondary battery, the positive electrode being prevented from having side reactions with an electrolyte solution and having excellent lifespan properties.

Also, another aspect of the present disclosure provides a positive electrode for a secondary battery, the positive electrode effectively reducing the degree of resistance increase caused by charge/discharge and having excellent output properties.

Also, another aspect of the present disclosure provides a positive electrode for a secondary battery, the positive electrode being prevented from having side reactions with an electrolyte solution and having excellent lifespan properties.

Also, another aspect of the present disclosure provides a lithium secondary battery including the above-described positive electrode for a secondary battery.

Technical Solution

According to an aspect of the present disclosure, there is provided a method for manufacturing a positive electrode for a secondary battery, the method including forming a positive electrode mixture layer including a positive electrode active material on a positive electrode current collector, and forming a metal oxide coating layer on the positive electrode mixture layer by atomic layer deposition, wherein the positive electrode active material includes lithium composite transition metal oxide particles and a boron-containing coating layer formed on the lithium composite transition metal oxide particles, and the lithium composite transition metal oxide particles include nickel (Ni), cobalt (Co), and manganese (Mn), wherein the nickel (Ni) is 60 mol % or greater of all metals excluding lithium.

According to another aspect of the present disclosure, there is provided a positive electrode for a secondary battery, the positive electrode including a positive electrode current collector, a positive electrode mixture layer formed on the positive electrode current collector and including a positive electrode active material, and a metal oxide coating layer formed on the positive electrode mixture layer, wherein the positive electrode active material includes lithium composite transition metal oxide particles and a boron-containing coating layer formed on the lithium composite transition metal oxide particles, and the lithium composite transition metal oxide particles include nickel (Ni), cobalt (Co), and manganese (Mn), wherein the nickel (Ni) is 60 mol % or greater of all metals excluding lithium, and the thickness of the metal oxide coating layer is 1 nm to 30 nm.

According to yet another aspect of the present disclosure, there is provided a lithium secondary battery including the above-described positive electrode for a secondary battery, a negative electrode positioned to face the positive electrode for a secondary battery, a separator interposed between the positive electrode for a secondary battery and the negative electrode, and an electrolyte.

ADVANTAGEOUS EFFECTS

According to a method for manufacturing a positive electrode for a secondary battery of the present disclosure, a positive electrode mixture layer including a positive electrode active material containing a boron-containing coating layer and a metal oxide coating layer formed on the positive electrode mixture layer by atomic layer deposition are formed. The boron-containing coating layer may sufficiently prevent the direct contact between the positive electrode active material and an electrolyte solution without inhibiting the entry and exit of lithium. In addition, the metal oxide coating layer formed thin and uniform by atomic layer deposition may effectively prevent side reactions with the electrolyte solution while preventing an excessive increase in resistance of a positive electrode. That is, a positive electrode for a lithium secondary battery manufactured by the above manufacturing method may have effectively reduced resistance increase which is caused by repeated charge/discharge, and thus, is preferable for improving output properties, and is effectively prevented from having side reactions with an electrolyte solution, and thus, is excellent in lifespan properties.

In addition, a positive electrode for a secondary battery of the present disclosure includes a positive electrode mixture layer including a positive electrode active material containing a boron-containing coating layer and a metal oxide coating layer formed on the positive electrode mixture layer and having a specific thickness range. The boron-containing coating layer may sufficiently prevent the direct contact between the positive electrode active material and an electrolyte solution without inhibiting the entry and exit of lithium. In addition, the metal oxide coating layer having a specific thickness range effectively prevents side reactions with the electrolyte solution while preventing an excessive increase in resistance of the positive electrode. Accordingly, the positive electrode for a secondary battery and a lithium secondary battery including the same may have improved output properties and an improved effect of preventing side reactions with an electrolyte solution.

MODES FOR CARRYING OUT THE PRESENT DISCLOSURE

It will be understood that words or terms used in the specification and claims of the present disclosure shall not be construed as being limited to having the meaning defined in commonly used dictionaries. It will be further understood that the words or terms should be interpreted as having meanings that are consistent with their meanings in the context of the relevant art and the technical idea of the present disclosure, based on the principle that an inventor may properly define the meaning of the words or terms to best explain the present disclosure.

The terminology used herein is for the purpose of describing particular exemplary embodiments only and is not intended to be limiting of the present disclosure. The terms of a singular form may include plural forms unless the context clearly indicates otherwise.

In the present specification, it should be understood that the terms "include," "comprise," or "have" are intended to specify the presence of stated features, numbers, steps, elements, or combinations thereof, but do not preclude the presence or addition of one or more other features, numbers, steps, elements, or combinations thereof.

In the present specification, an average particle diameter ($D_{50}$) may be defined as a particle diameter corresponding to 50% of the volume accumulation in a particle diameter distribution curve of a particle. The average particle diameter ($D_{50}$) may be measured by, for example, a laser diffraction method. The laser diffraction method generally enables measurement of a particle diameter from a sub-micron region to several millimeters, so that results of high reproducibility and high resolution may be obtained.

Hereinafter, the present disclosure will be described in more detail.

<Method for Manufacturing Positive Electrode for Secondary Battery>

The present disclosure relates to a method for manufacturing a positive electrode for a secondary battery, and specifically, to a method for manufacturing a positive electrode for a lithium secondary battery.

The method for manufacturing a positive electrode for a secondary battery of the present disclosure includes forming a positive electrode mixture layer including a positive electrode active material on a positive electrode current collector, and forming a metal oxide coating layer on the positive electrode mixture layer by atomic layer deposition, wherein the positive electrode active material includes lithium composite transition metal oxide particles and a boron-containing coating layer formed on the lithium composite transition metal oxide particles, and the lithium composite transition metal oxide particles include nickel (Ni), cobalt (Co), and manganese (Mn), wherein the nickel (Ni) is 60 mol % or greater of all metals excluding lithium.

According to the method for manufacturing a positive electrode for a secondary battery, a metal oxide coating layer is formed by atomic layer deposition on a positive electrode mixture layer including a positive electrode active material containing a boron-containing coating layer. The boron-containing coating layer included in the positive electrode active material may easily transfer lithium ions to the surface of the active material, and at the same time, may serve as a coating layer for preventing the lithium composite transition metal oxide particles from directly contacting an electrolyte solution. Accordingly, the boron-containing coating layer may have effectively reduced resistance increase which is caused by repeated charge/discharge, and the effect of preventing side reactions between the lithium composite transition metal oxide particles and the electrolyte solution and the effect of improving the durability of the positive electrode active material may be simultaneously obtained.

In addition, the positive electrode for a secondary battery manufactured by the manufacturing method has the metal oxide coating layer formed by atomic layer deposition. A positive electrode active material containing nickel in a high content has a problem in that the resistance thereof is increased according to charge/discharge. However, in the case of present disclosure, since a metal oxide coating layer is formed thin and uniform by atomic layer deposition, thereby not deteriorating the resistance increase prevention effect of the boron-containing coating layer described above, so that output properties may be improved. Also, the metal oxide coating layer may effectively prevent side reactions with an electrolyte solution, and particularly, may prevent side reactions caused by hydrofluoric acid (HF) which are difficult to prevent with the boron-containing coating layer, so that the lifespan properties of a battery may be further improved.

The method for manufacturing a positive electrode for a secondary battery of the present disclosure includes a step of forming a positive electrode mixture layer containing a positive electrode active material on a positive electrode current collector.

The positive electrode current collector is not particularly limited as long as it has conductivity without causing a chemical change in a battery. For example, stainless steel, aluminum, copper, nickel, titanium, fired carbon, or aluminum or stainless steel that is surface-treated with one of carbon, nickel, titanium, silver, and the like may be used.

The positive electrode current collector may typically have a thickness of 3-500 μm, and microscopic irregularities may be formed on the surface of the positive electrode current collector to improve the adhesion of a positive electrode active material. For example, the positive electrode current collector may be used in various forms such as a film, a sheet, a foil, a net, a porous body, a foam, a non-woven body, and the like.

The positive electrode mixture layer is formed on the positive electrode current collector.

The positive electrode mixture layer contains a positive electrode active material. Specifically, the positive electrode active material includes lithium composite transition metal oxide particles and a boron-containing coating layer formed on the lithium composite transition metal oxide particles.

The lithium composite transition metal oxide particles include nickel (Ni), cobalt (Co), and manganese (Mn).

The lithium composite transition metal oxide particles are high-Ni lithium composite transition metal oxide particles containing 60 mol % or greater of the nickel (Ni) of all metals excluding lithium. Preferably, the lithium composite transition metal oxide particles may contain 80 mol % or greater of the nickel (Ni) of all metals excluding lithium. As in the present disclosure, when high-Ni lithium composite transition metal oxide particles having the content of nickel (Ni) in the above-described range of all metals excluding lithium is used, it is possible to secure an even higher capacity.

The lithium composite transition oxide particle may include a compound represented by Formula 1 below.

$$Li_pNi_{1-x-y-z}Co_xMn_yM1_zO_2 \quad \text{[Formula 1]}$$

In Formula 1, $0.9 \leq p \leq 1.5$, $0 < x \leq 0.4$, $0 < y \leq 0.4$, $0 \leq z \leq 0.1$, and $0 < x+y+z \leq 0.4$, and M1 is at least one selected from the group consisting of P, B, Al, Si, W, Zr, and Ti.

In a compound represented by Formula 1 above, Li may be in a content corresponding to p, wherein $0.9 \leq p \leq 1.5$, specifically $1 \leq p \leq 1.2$, more specifically $1.02 \leq p \leq 1.05$. When the above range is satisfied, the output and capacity properties of a battery may be significantly improved.

In the compound represented by Formula 1 above, Ni may be included in a content corresponding to $1-(x+y+z)$, for example, $0.61-(x+y+z)<1$, specifically $0.8 \leq 1-(x+y+z)<1$, and accordingly, it is possible to secure a high capacity of a battery.

In the lithium composite transition metal oxide of Formula 1 above, Co may be included in a content corresponding to x, that is, $0 < x \leq 0.4$. When x of Formula 1 above is in the above-described range, it is preferable in terms of costs.

In the compound represented by Formula 1 above, Mn may improve the stability of an active material, and thus, may improve the stability of a battery. When considering the effect of improving lifespan properties, Mn may be included in a content corresponding to y, that is, $0 < y \leq 0.4$. When y of Formula 1 above is in the above-described range, it is preferable in terms of improving the output properties and capacity properties of a battery.

In the compound represented by Formula 1 above, M1 is a doping element, and is at least one selected from the group consisting of P, B, Al, Si, W, Zr, and Ti. M1 may be included in a content corresponding to z, wherein $0 \leq z \leq 0.1$.

The boron-containing coating layer is formed on the lithium composite transition metal oxide particles.

The boron-containing coating layer is formed on the lithium composite transition metal oxide particles to prevent the lithium composite transition metal oxide particles from being in direct contact with an electrolyte solution, and thus, may serve as a protection layer for preventing side reactions with the electrolyte solution and improving the durability of the particles.

In addition, the boron-containing coating layer may have a lattice-chain porous structure, and thus, may allow the entry/exit of lithium ions into/from the lithium composite transition metal oxide particles. Therefore, the boron-containing coating layer may serve as a buffer layer capable of transferring lithium ions to the surface of particles. Accordingly, the boron-containing coating layer may effectively reduce the degree of resistance increase caused by the charge/discharge of a high-nickel active material while protecting the lithium composite transition metal oxide particles. Accordingly, the lifespan properties and output properties of a battery may be significantly improved.

The boron-containing coating layer may be formed by mixing the lithium composite transition metal oxide particles and a boron-containing precursor, following by firing the mixture.

The boron-containing precursor may be at least one selected from the group consisting of boronic acid ($H_3BO_3$), boron carbide ($B_4C$), and sodium borohydride ($NaBH_4$), preferably at least one selected from the group consisting of boronic acid ($H_3BO_3$) and boron carbide ($B_4C$), more preferably boronic acid ($H_3BO_3$). When a boron-containing precursor of the above-described type is used, the lithium composite transition metal oxide particles may be more uniformly coated, so that the effect of improving output properties and lifespan properties described above may be implemented to an excellent level.

The firing temperature is not particularly limited, and may be 200° C. to 400° C., preferably 250° C. to 350° C. When the above temperature range is satisfied, the mobility of lithium ions of the boron-containing coating layer may be further improved.

It is preferable that the firing is performed in an oxygen atmosphere in terms of forming a coating layer smoothly.

The boron-containing coating layer may be included in a positive electrode active material in an amount of 0.05 wt % to 0.2 wt %, preferably 0.07 wt % to 0.15 wt %, based on 100 wt % of the positive electrode active material. It is preferable that the above weight range is satisfied in terms of further improving the output properties of a positive electrode active material while reducing the resistance thereof.

The boron-containing coating layer may include at least one selected from the group consisting of a lithium boron oxide and a boron oxide. Specifically, the lithium boron oxide may include $Li_aB_bO_c$ ($1 \leq a \leq 4$, $1 \leq b \leq 4$, $1 \leq c \leq 8$), and the boron oxide may include $B_dO_e$ ($1 \leq d \leq 4$, $1 \leq e \leq 4$).

Specifically, the boron-containing coating layer may include at least one selected from the group consisting of $LiBO_3$, $Li_2B_4O_7$, and $B_2O_3$.

The boron-containing coating layer may form a lattice-chain porous structure in the coating layer in which at least one compound selected from the group consisting of a lithium boron oxide and a boron oxide contained therein forms a binding structure of 2 or more. The boron-containing coating layer may for a lattice having a size enough to sufficiently prevent side reactions with an electrolyte solution without inhibiting the entry/exit of lithium ions, so that the degree of resistance increase of the active material may be effectively reduced.

The average particle diameter ($D_{50}$) of the positive electrode active material may be 5 μm to 20 μm, preferably 7 μm to 12 μm. In terms of improving the energy density of a positive electrode, it is preferable that the above range is satisfied.

The content of the positive electrode active material is not particularly limited. Specifically, the positive electrode active material may be included in an amount of 80 wt % to 99 wt % based on the total weight of the positive electrode mixture layer.

The positive electrode mixture layer may further include a conductive material and a binder, together with the positive electrode active material described above.

The conductive material is used to impart conductivity to an electrode, and any conductive material may be used without particular limitation as long as it has electron conductivity without causing a chemical change in a battery to be constituted. Specific examples thereof may include graphite such as natural graphite and artificial graphite; a carbon-based material such as carbon black, acetylene black, Ketjen black, channel black, furnace black, lamp black, thermal black, and carbon fiber; metal powder or metal fiber of such as copper, nickel, aluminum, and silver; a conductive whisker such as zinc oxide and potassium titanate; a conductive metal oxide such as titanium oxide; or a conductive polymer such as a polyphenylene derivative, and any one thereof or a mixture of two or more thereof may be used. Typically, the conductive material may be included in an amount of 1-30 wt % based on the total weight of the positive electrode mixture layer.

The binder serves to improve the bonding between positive electrode active material particles and the adhesion between a positive electrode active material and a positive electrode current collector. Specific examples thereof may include polyvinylidene fluoride (PVDF), a polyvinylidene fluoride-hexafluoropropylene copolymer (PVDF-co-HFP), polyvinyl alcohol, polyacrylonitrile, carboxymethyl cellulose (CMC), starch, hydroxypropyl cellulose, regenerated cellulose, polyvinylpyrrolidone, tetrafluoroethylene, polyethylene, polypropylene, an ethylene-propylene-diene monomer (EPDM), a sulfonated EPDM, styrene-butadiene rubber (SBR), fluorine rubber, or various copolymers thereof, and any one thereof or a mixture of two or more thereof may be used. The binder may be included in an amount of 1-30 wt % based on the total weight of the positive electrode mixture layer.

The positive electrode mixture layer may be manufactured according to a typical method for manufacturing a positive electrode. Specifically, the positive electrode mixture layer may be manufactured by applying a composition for forming a positive electrode mixture layer which includes the positive electrode active material, and selectively, a binder and a conductive material, on a positive electrode current collector, followed by drying and roll-pressing. At this time, the type and content of the positive electrode active material, the binder, and the conductive material are as described above.

The solvent may be a solvent commonly used in the art, and may be dimethyl sulfoxide (DMSO), isopropyl alcohol, N-methylpyrrolidone (NMP), acetone, water, or the like. Any one thereof or a mixture of two or more thereof may be used. The amount of the solvent to be used is sufficient if the solvent may dissolve or disperse the positive electrode active material, the binder, and the conductive material when considering the applying thickness and preparation yield of a slurry, and have a viscosity which may exhibit excellent thickness uniformity when being applied for manufacturing a positive electrode thereafter.

In addition, in another method, the positive electrode mixture layer may be manufactured by casting the composition for forming a positive electrode mixture layer on a separate support, and then laminating a film obtained by being peeled off from the support on a positive electrode current collector.

The method for manufacturing a positive electrode for a secondary battery of the present disclosure includes a step of forming a metal oxide coating layer on the positive electrode mixture layer by atomic layer deposition.

A positive electrode for a secondary battery manufactured by the manufacturing method of the present disclosure includes a metal oxide coating layer formed by atomic layer deposition, and the metal oxide coating layer may prevent side reactions with an electrolyte solution to an excellent level, so that the lifespan properties of a battery may be improved. Particularly, there is a problem in that side reactions occurring between hydrofluoric acid (HF) generated from an electrolyte solution and lithium composite transition metal oxide particles are not sufficiently prevented only with the boron-containing coating layer described above. However, since the metal oxide coating layer is coated on the positive electrode mixture layer, the side reaction problem with hydrofluoric acid may be significantly prevented, and thus, the lifespan properties of the battery may be improved to an excellent level.

In addition, the metal oxide coating layer is formed by atomic layer deposition, and thus, the coating layer may be formed thin and uniform, and may prevent electrolyte solution side reactions to an excellent level while reducing resistance increase due to charge/discharge. In particular, the positive electrode for a secondary battery manufactured by the manufacturing method of the present disclosure performs the prevention of electrolyte solution side reactions using the boron-containing coating layer described above, and thus, even though a metal oxide coating layer is formed thin, an effect of sufficiently preventing electrolyte solution side reactions may be achieved. Also, the resistance increase and output reduction of a battery due to the metal oxide coating layer being excessively thick may be prevented.

Atomic layer deposition is a deposition method by a nano-thin film deposition technique using a phenomenon in which a mono-atomic layer is chemically attached. Specifically, by alternately adsorbing and substituting molecules on the surface of a substrate, it is possible to achieve ultra-fine layer-by-layer deposition of an atomic layer thickness and to stack an oxide and a metal thin film as thin as possible, and a metal oxide coating layer may be easily formed under a temperature lower than that of chemical vapor deposition (CVD) for depositing particles formed by a chemical reaction of a gas onto the surface of a substrate.

The atomic layer deposition method is not a CVD method in which a thin film is deposited by the thermal decomposition and a vapor phase reaction of a reaction gas, but is a reaction in which a thin film is formed in the manner in which the chemical adsorption of one reactant occurs on a substrate on which the thin film is to be deposited and then the chemical adsorption of a second reactant, a third reactant, or the like occurs again on the substrate.

That is, the atomic layer deposition method is a method for forming a thin film by chemical adsorption through a periodic supply of each reactant, and since a reaction occurs only on a reactant and a surface and does not occur between a reactant and a reactant, and deposition may be achieved in atomic units. Also, the method may be repeatedly performed to obtain a desired thin film thickness.

An apparatus capable of performing the atomic layer deposition may be an atomic layer deposition apparatus commonly used in the art. For example, Savannah 100 system (manufactured by Cambridge Nanotech Co., Ltd.) may be used, but the present disclosure is not limited thereto.

The atomic layer deposition may perform at least one cycle comprised of the following steps: positioning the positive electrode mixture layer in a chamber; adding a metal precursor into the chamber; adding a purge gas into the chamber; adding an oxidization agent on the positive electrode mixture layer to form a metal oxide coating layer; and adding a purge gas into the chamber to remove an unreacted residual oxidization agent.

The metal precursor may include at least one selected from the group consisting of aluminum (Al), barium (Ba), titanium (Ti), and manganese (Mn), preferably at least one selected from the group consisting of Al and Ti, more preferably Al, and it is more preferable that the metal precursor includes a metal atom described above in terms of preventing resistance increase and preventing electrolyte side reactions.

Specifically, when the metal precursor includes Al, the metal precursor may include at least one selected from the group consisting of trimethyl aluminum (TMA), triethyl aluminum (TEA), and tris(diethylamido)aluminum (TBTDET), preferably trimethyl aluminum.

The purge gas may be at least one selected from the group consisting of Ar, $N_2$, and air, preferably Ar.

The oxidization agent may be water vapor.

The metal oxide coating layer may include at least one selected from the group consisting of $Al_2O_3$, BaO, $TiO_2$, and MnO, preferably $Al_2O_3$, in terms of preventing the resistance increase of the metal oxide coating layer and improving the effect of preventing electrolyte side reactions.

The atomic layer deposition may be performed at 80° C. to 150° C., preferably 100° C. to 130° C., and it is preferable that the deposition is performed in the above-described temperature range in terms of performing a reaction smoothly and forming a coating layer uniformly.

The process of forming a metal oxide coating layer by the atomic layer deposition may be represented by, for example, Reaction Equation 1 below in the case of $Al_2O_3$.

$$2Al(CH_3)_3 + 3H_2O \rightarrow Al_2O_3 6CH_4 \text{[Reaction Equation 1]}$$

That is, when trimethyl aluminum $(Al(CH_3)_3)$ is used as a metal precursor as in Reaction Equation 1, the trimethyl aluminum may react with an injected oxidization agent (water vapor) to form an aluminum oxide coating layer.

The metal oxide coating layer may be formed by performing 1 to 5 cycles, preferably 2 to 4 cycles of the atomic layer deposition. When the atomic layer deposition is performed in the above-described number of cycles, it is preferable in that an increase in resistance due to the coating layer being excessively thick may be prevented and side reactions with an electrolyte solution may be effectively prevented.

The thickness of the metal oxide coating layer may be 1 nm to 30 nm, preferably 3 nm to 8 nm, more preferably 3.5 nm to 6.5 nm. When the thickness thereof is in the above thickness range, it is preferable in that an increase in resistance due to the coating layer being excessively thick may be prevented and side reactions with an electrolyte solution may be effectively prevented.

The metal oxide coating layer may be formed in a content of 0.01 wt % to 0.1 wt %, preferably 0.02 wt % to 0.085 wt %, more preferably 0.035 wt % to 0.08 wt %, based on the total weight of a positive electrode for secondary battery. In terms of effectively preventing the increase in resistance of a positive electrode, it is preferable that the above range is satisfied.

<Positive Electrode for Secondary Battery>

The present disclosure provides a positive electrode for a secondary battery, specifically, a positive electrode for a lithium secondary battery.

The positive electrode for a lithium secondary battery includes a positive electrode current collector, a positive electrode mixture layer formed on the positive electrode current collector and including a positive electrode active material, and a metal oxide coating layer formed on the positive electrode mixture layer, wherein the positive electrode active material includes lithium composite transition metal oxide particles and a boron-containing coating layer formed on the lithium composite transition metal oxide particles, and the lithium composite transition metal oxide particles include nickel (Ni), cobalt (Co), and manganese (Mn), wherein the nickel (Ni) is 60 mol % or greater of all metals excluding lithium, and the thickness of the metal oxide coating layer is 1 nm to 30 nm.

The positive electrode for a secondary battery includes a positive electrode mixture layer including a positive electrode active material containing a boron-containing coating layer and a metal oxide coating layer formed on the positive electrode mixture layer. The boron-containing coating layer included in the positive electrode active material may easily transfer lithium ions to the surface of the active material, and at the same time, may serve as a coating layer for preventing the lithium composite transition metal oxide particles from directly contacting an electrolyte solution. Accordingly, the boron-containing coating layer may have effectively reduced resistance increase which is caused by repeated charge/discharge, and the effect of preventing side reactions between the lithium composite transition metal oxide particles and the electrolyte solution and the effect of improving the durability of the positive electrode active material may be simultaneously obtained.

In addition, the positive electrode for a secondary battery includes a metal oxide coating layer by atomic layer deposition, and the thickness of the metal oxide coating layer is adjusted to be 1-30 nm. A positive electrode active material containing nickel in a high content has a problem in that the resistance thereof is increased according to charge/discharge. However, in the case of present disclosure, since a metal oxide coating layer is formed thin and uniform in the above range by atomic layer deposition, thereby not deteriorating the resistance increase prevention effect of the boron-containing coating layer described above, so that output properties may be improved. Also, the metal oxide coating layer may effectively prevent side reactions with an electrolyte solution, and particularly, may prevent side reactions caused by hydrofluoric acid (HF) which are difficult to prevent with the boron-containing coating layer, so that the lifespan properties of a battery may be further improved.

The thickness of the metal oxide coating layer may be 1 nm to 30 nm, preferably 3 nm to 8 nm, more preferably 3.5 nm to 6.5 nm. When the thickness thereof is in the above thickness range, it is preferable in that an increase in resistance due to the coating layer being excessively thick may be prevented and side reactions with an electrolyte solution may be effectively prevented. The thickness of a metal oxide coating layer in the above-described range may be easily implemented by the above-described atomic layer deposition method.

The metal oxide coating layer may be included in a positive electrode for a secondary battery in an amount of 0.01 wt % to 0.1 wt %, preferably 0.02 wt % to 0.085 wt %, and more preferably 0.035 wt % to 0.08 wt %, based on the total weight of the positive electrode for a secondary battery. In terms of effectively preventing the increase in resistance of a positive electrode, it is preferable that the above range is satisfied.

The type, composition, and manufacturing method of each of the positive electrode current collector, the positive electrode mixture layer, the positive electrode active material, and the metal oxide coating layer may be the same as those described above.

<Lithium Secondary Battery>

In addition, the present disclosure provides an electrochemical device including the positive electrode for a secondary battery. The electrochemical device may be specifically a battery, a capacitor, or the like, and more specifically, may be a lithium secondary battery.

Specifically, the lithium secondary battery includes a positive electrode, a negative electrode positioned to face the positive electrode, a separator interposed between the positive electrode and the negative electrode, and an electrolyte, and the positive electrode is the same as the positive electrode for a secondary battery described above. Also, the lithium secondary battery may selectively further include a battery case for accommodating an electrode assembly composed of the positive electrode, the negative electrode, and the separator, and a sealing member for sealing the battery case.

In the lithium secondary battery, the negative electrode includes a negative electrode current collector and a negative electrode mixture layer positioned on the negative electrode current collector.

The negative electrode current collector is not particularly limited as long as it has a high conductivity without causing a chemical change in a battery. For example, copper, stainless steel, aluminum, nickel, titanium, fired carbon, copper or stainless steel that is surface-treated with one of carbon, nickel, titanium, silver, and the like, an aluminum-cadmium alloy, and the like may be used. Also, the negative electrode current collector may typically have a thickness of 3-500 μm, and as in the case of the positive electrode current collector, microscopic irregularities may be formed on the surface of the negative electrode current collector to improve the adhesion of a negative electrode active material. For example, the negative electrode current collector may be used in various forms such as a film, a sheet, a foil, a net, a porous body, a foam, a non-woven body, and the like.

The negative electrode mixture layer selectively includes a binder and a conductive material together with a negative electrode active material. As an example, the negative electrode mixture layer may be prepared by applying a composition for forming a negative electrode including a negative electrode active material and selectively a binder and a conductive material on a negative electrode current collector, following by drying. Alternatively, the negative electrode mixture layer may be prepared by casting the composition for forming a negative electrode on a separate support, and then laminating a film obtained by being peeling off from the support on a negative electrode current collector.

As the negative electrode active material, a compound capable of reversible intercalation and de-intercalation of lithium may be used. Specific examples thereof may include a carbonaceous material such as artificial graphite, natural graphite, graphitized carbon fiber, and amorphous carbon; a metallic compound alloyable with lithium such as Si, Al, Sn, Pb, Zn, Bi, In, Mg, Ga, Cd, an Si alloy, an Sn alloy, or an Al alloy; a metal oxide which may be doped and undoped with lithium such as $SiO\beta$ ($0<\beta<2$), $SnO_2$, a vanadium oxide, and a lithium vanadium oxide; or a composite including the metallic compound and the carbonaceous material such as an Si—C composite or an Sn—C composite, and any one thereof or a mixture of two or more thereof may be used. Also, a lithium thin film may be used as the negative electrode active material. Furthermore, low crystalline carbon, high crystalline carbon and the like may all be used as a carbon material. Representative examples of the low crystalline carbon may include soft carbon and hard carbon, and representative examples of the high crystalline carbon may include irregular, planar, flaky, spherical, or fibrous natural graphite or artificial graphite, Kish graphite, pyrolytic carbon, mesophase pitch-based carbon fiber, mesocarbon microbeads, mesophase pitches, and high-temperature sintered carbon such as petroleum or coal tar pitch derived cokes.

Also, the binder and the conductive material may be the same as those described above in the description of the positive electrode.

Meanwhile, in the lithium secondary battery, a separator is to separate the negative electrode and the positive electrode and to provide a movement path for lithium ions. Any separator may be used without particular limitation as long as it is typically used as a separator in a lithium secondary battery. Particularly, a separator having high moisture-retention ability for an electrolyte as well as low resistance to the movement of electrolyte ions is preferable. Specifically, a porous polymer film, for example, a porous polymer film manufactured using a polyolefin-based polymer such as an ethylene homopolymer, a propylene homopolymer, an ethylene/butene copolymer, an ethylene/hexene copolymer, and an ethylene/methacrylate copolymer, or a laminated structure having two or more layers thereof may be used. Also, a typical porous non-woven fabric, for example, a non-woven fabric formed of glass fiber having a high melting point, polyethylene terephthalate fiber, or the like may be used. Also, a coated separator including a ceramic component or a polymer material may be used to secure heat resistance or mechanical strength, and may be selectively used in a single-layered or a multi-layered structure.

In addition, the electrolyte used in the present disclosure may be an organic liquid electrolyte, an inorganic liquid electrolyte, a solid polymer electrolyte, a gel-type polymer electrolyte, a solid inorganic electrolyte, a molten-type inorganic electrolyte, and the like, all of which may be used in the manufacturing of a lithium secondary battery, but is not limited thereto.

Specifically, the electrolyte may include an organic solvent and a lithium salt.

Any organic solvent may be used as the organic solvent without particular limitation as long as it may serve as a medium through which ions involved in an electrochemical reaction of the battery may move. Specifically, as the organic solvent, an ester-based solvent such as methyl acetate, ethyl acetate, γ-butyrolactone, and ε-caprolactone; an ether-based solvent such as dibutyl ether or tetrahydrofuran; a ketone-based solvent such as cyclohexanone; an aromatic hydrocarbon-based solvent such as benzene and fluorobenzene; a carbonate-based solvent such as dimethyl carbonate (DMC), diethyl carbonate (DEC), methylethyl carbonate (MEC), ethylmethyl carbonate (EMC), ethylene carbonate (EC), and propylene carbonate (PC); an alcohol-based solvent such as ethyl alcohol and isopropyl alcohol; nitriles such as R—CN (where R is a linear, branched, or cyclic C2 to C20 hydrocarbon group and may include a double-bond aromatic ring or ether bond); amides such as dimethylformamide; dioxolanes such as 1,3-dioxolane; or sulfolanes may be used. Among the above solvents, a carbonate-based solvent is preferable, and a mixture of a cyclic carbonate (e.g., ethylene carbonate or propylene carbonate) having high ionic conductivity and high dielectric constant, which may increase charging/discharging performance of the battery, and a low-viscosity linear carbonate-based compound (e.g., ethylmethyl carbonate, dimethyl carbonate, or diethyl carbonate) is more preferable. In this case, the performance of the electrolyte may be excellent when the cyclic carbonate and the chain carbonate are mixed in a volume ratio of about 1:1 to about 1:9.

Any compound may be used as the lithium salt without particular limitation as long as it may provide lithium ions used in a lithium secondary battery. Specifically, $LiPF_6$, $LiClO_4$, $LiAsF_6$, $LiBF_4$, $LiSbF_6$, $LiAlO_4$, $LiAlCl_4$, $LiCF_3SO_3$, $LiC_4F_9SO_3$, $LiN(C_2F_5SO_3)_2$, $LiN(CF_3SO_2)_2$, $LiN(CF_3SO_2)_2$. LiCl, LiI, or $LiB(C_2O_4)_2$ may be used as the lithium salt. The lithium salt may be used in a concentration range of 0.1-2.0 M. When the concentration of the lithium salt is in the above range, the electrolyte has suitable conductivity and viscosity, thereby exhibiting excellent performance, and lithium ions may effectively move.

In the electrolyte, in order to improve the lifespan properties of a battery, suppress the decrease in battery capacity, and improve the discharge capacity of the battery, one or more kinds of additives, for example, a halo-alkylene carbonate-based compound such as difluoroethylene carbonate, pyridine, triethylphosphite, triethanolamine, cyclic ether, ethylenediamine, n-glyme, hexaphosphoric triamide, a nitrobenzene derivative, sulfur, a quinone imine dye, N-substituted oxazolidinone, N,N-substituted imidazolidine, ethylene glycol dialkyl ether, an ammonium salt, pyrrole, 2-methoxy ethanol, or aluminum trichloride, and the like may be further included. At this time, the additive may be included in an amount of 0.1-5 wt % based on the total weight of the electrolyte.

The lithium secondary battery including the positive electrode active material for a lithium secondary battery according to the present disclosure as describe above stably exhibits excellent discharging capacity, output properties, and capacity retention rate, and thus, are useful for portable devices such as a mobile phone, a notebook computer, and a digital camera, and in the field of electric cars such as a hybrid electric vehicle (HEV).

Accordingly, the present disclosure provides a battery module including the lithium secondary battery as a unit cell, and a battery pack including the same.

The battery module or the battery pack may be used as a power source of one or more medium-and-large-sized devices, for example, a power tool, an electric car such as an electric vehicle (EV), a hybrid electric vehicle (HEV), and a plug-in hybrid electric vehicle (PHEV), and a system for storing power.

EXAMPLES FOR CARRYING OUT THE PRESENT DISCLOSURE

Hereinafter, Examples of the present disclosure will be described in detail so that those skilled in the art may easily carry out the present disclosure. However, the present disclosure may be embodied in many different forms, and is not limited to Examples set forth herein.

EXAMPLES

Example 1: Manufacturing of Positive Electrode for Secondary Battery

Lithium composite transition metal oxide particles of $LiNi_{0.82}Co_{0.12}Mn_{0.06}O_2$ were prepared, and boronic acid ($H_3BO_3$) was dispersed on the lithium composite transition metal oxide particles, followed by performing a heat treatment thereon for 5 hours at 300° C. to prepare a positive electrode active material (average particle diameter: 10 μm) having a boron-containing coating layer (including $LiBO_3$, $Li_2B_4O_7$, $B_2O_3$) formed on the surface. The content of the boron-containing coating layer was 0.1 wt % of the total weight of the positive electrode active material.

The positive electrode active material prepared above, denka black conductive material, and a PVdF binder were mixed at a weight ratio of 98:2:2 in an NMP solvent to prepare a positive electrode mixture, and the positive electrode mixture was applied on one surface of an aluminum current collector, dried at 130° C., and then roll-pressed such that the density of an electrode becomes 3.5 g/cc to form a positive electrode mixture layer.

The positive electrode mixture layer was position inside a chamber, and trimethyl aluminum (TMA) was injected as a metal precursor into the chamber of 120° C., followed by injecting Ar as a purge gas. Thereafter, water vapor was injected as an oxidization agent to form a metal oxide coating layer of $Al_2O_3$ on the positive electrode mixture layer, and an Ar purge gas was injected into the chamber to remove an unreacted residual oxidization agent. The above steps were set as one cycle, and a total of two cycles were performed to form a metal oxide coating layer of $Al_2O_3$ (thickness: 4 nm, content: 0.05 wt % based on the weight of the positive electrode for a secondary battery), thereby manufacturing a positive electrode for a secondary battery.

Example 2: Manufacturing of Positive Electrode for Secondary Battery

A positive electrode for a secondary battery was manufactured in the same manner as in Example 1 except that the atomic layer deposition cycle was performed once when performing the atomic layer deposition of a metal oxide coating layer.

The thickness of the metal oxide coating layer was 2 nm, and the content thereof was 0.025 wt % based on the weight of the positive electrode for a secondary battery.

Example 3: Manufacturing of Positive Electrode for Secondary Battery

A positive electrode for a secondary battery was manufactured in the same manner as in Example 1 except that the atomic layer deposition cycle was performed a total of 3 times when performing the atomic layer deposition of a metal oxide coating layer.

The thickness of the metal oxide coating layer was 6 nm, and the content thereof was 0.075 wt % based on the weight of the positive electrode for a secondary battery.

Example 4: Manufacturing of Positive Electrode for Secondary Battery

A positive electrode for a secondary battery was manufactured in the same manner as in Example 1 except that the atomic layer deposition cycle was performed a total of 5 times when performing the atomic layer deposition of a metal oxide coating layer.

The thickness of the metal oxide coating layer was 10 nm, and the content thereof was 0.12 wt % based on the weight of the positive electrode for a secondary battery.

Comparative Example 1: Manufacturing of Positive Electrode for Secondary Battery A positive electrode for a secondary battery was manufactured in the same manner as in Example 1 except that lithium composite transition metal oxide particles of $LiNi_{0.82}Co_{0.12}Mn_{0.6}O_2$ (average particle diameter: 10 μm) having no boron-containing coating layer was used as a positive electrode active material and a metal oxide coating layer was not formed.

Comparative Example 2: Manufacturing of Positive Electrode for Secondary Battery A positive electrode for a secondary battery was manufactured in the same manner as in Example 1 except that a metal oxide coating layer was not formed.

Comparative Example 3: Manufacturing of Positive Electrode for Secondary Battery A positive electrode for a secondary battery was manufactured in the same manner as in Example 1 except that lithium composite transition metal oxide particles of $LiNi_{0.82}Co_{0.12}Mn_{0.6}O_2$ (average particle diameter: 10 μm) having no boron-containing coating layer was used as a positive electrode active material.

EXPERIMENTAL EXAMPLES

<Manufacturing of Lithium Secondary Battery>

The positive electrode for a secondary battery manufactured in each of Examples 1 to 4 and Comparative Examples 1 to 3 was prepared. As a negative electrode, a lithium metal was prepared.

A porous polyethylene separator was interposed between the positive electrode for a secondary battery manufactured in each of Examples 1 to 4 and Comparative Examples 1 to 3 and the lithium metal negative electrode to prepare an electrode assembly, and the electrode assembly was placed inside a case. Thereafter, an electrolyte solution was injected into the case to manufacture a lithium secondary battery of each of Examples 1 to 4 and Comparative Examples 1 to 3. At this time, the electrolyte solution was prepared by dissolving lithium hexafluorophosphate ($LiPF_6$) to a 1.0 M concentration in an organic solvent in which ethylene carbonate (EC), dimethyl carbonate (DMC), and ethylmethyl carbonate (EMC) are mixed at a volume ratio of 3:4:3.

Experimental Example 1: Identification of Capacity

The lithium secondary batteries (coin cells) manufactured as described above were charged and discharged at 45° C. under the conditions of a charge final voltage of 4.25 V, a discharge final voltage of 2.5 V, and 0.2 C/0.2 C, and then, the initial charge capacity and discharge capacity each thereof were measured. The results are shown in Table 1 below.

TABLE 1

|  | Charge capacity (mAh/g) | Discharge capacity (mAh/g) |
| --- | --- | --- |
| Example 1 | 226 | 205 |
| Example 2 | 226 | 205 |
| Example 3 | 226 | 204 |
| Example 4 | 226 | 202 |
| Comparative Example 1 | 226 | 200 |
| Comparative Example 2 | 226 | 205 |
| Comparative Example 3 | 226 | 200 |

Referring to Table 1, the lithium secondary battery of each of Examples 1 to 3 exhibits an equal level of discharge capacity or higher compared to the lithium secondary battery of each of Comparative Example 1 and 3.

Meanwhile, the lithium secondary battery of Example 4 had a thicker metal oxide coating layer compared to those of Examples 1 to 3, thereby having increased resistance, so that it was confirmed that the capacity properties thereof were lower that the capacity properties of the lithium secondary battery of each of Examples 1 to 3.

Also, the lithium secondary battery of Comparative Example 2 exhibits an equal level of capacity retention rate when compared to those of Examples. However, as to be described below, the lithium secondary battery of Comparative Example 2 has a very high degree of resistance increase compared to those of Examples, and thus, has poor performance (refer to Experimental Example 3).

Experimental Example 2: Evaluation of Capacity Retention Rate

While the lithium secondary batteries manufactured as described above were being charged and discharged at 45° C. for 30 cycles under the conditions of a charge final voltage of 4.25 V, a discharge final voltage of 2.5 V, and 0.3 C/0.3 C, the capacity retention rate (%) each thereof was measured. The results are shown in Table 2 and FIG. 1 below.

TABLE 2

|  | Capacity retention rate @ $30^{th}$ cycle (%) |
| --- | --- |
| Example 1 | 94.2 |
| Example 2 | 92.8 |
| Example 3 | 94.0 |
| Comparative Example 1 | 80.0 |
| Comparative Example 2 | 94.4 |
| Comparative Example 3 | 91.2 |

Figure 1:
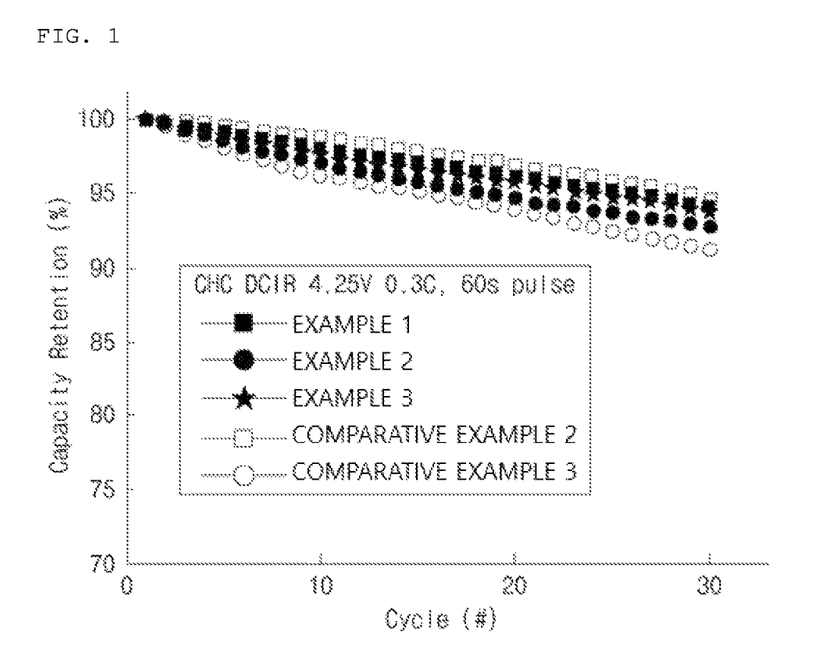
FIG. 1 is a graph showing the capacity retention rate according to charge/discharge cycles of a lithium secondary battery according to each of Examples 1 to 3, Comparative Example 2, and Comparative Example 3.

Referring to Table 2 and FIG. 1, the lithium secondary battery of each of Examples 1 to 3 exhibits an excellent capacity retention rate compared to the lithium secondary battery of each of Comparative Example 1 and 3.

The lithium secondary battery of Comparative Example 2 exhibits an equal level of capacity retention rate when compared to those of Examples. However, as to be described below, the lithium secondary battery of Comparative Example 2 has a very high degree of resistance increase compared to those of Examples, and thus, has poor performance (refer to Experimental Example 3).

Experimental Example 3: Evaluation of Resistance

While the lithium secondary batteries manufactured as described above were being charged and discharged at 45° C. for 30 cycles under the conditions of a charge final voltage of 4.25 V, a discharge final voltage of 2.5 V, and 0.3 C/0.3 C, the degree of resistance increase each thereof was measured. The results are shown in Table 3 and FIG. 2 below.

The resistance increase rate is calculated by Equation 1 below.

Resistance increase rate (%)=(DCIR$_2$−DCIR$_1$)/DCIR$_1$×100     [Equation 1]

(In Equation 1, DCIR$_1$ represents a resistance (Ohm) measured at the 1$^{st}$ cycle, and DCIR$_2$ represents a resistance (Ohm) measured at the 30$^{th}$ cycles.)

TABLE 3

|  | DCIR@ @ 1$^{st}$ Cycle (Ohm) | DCIR@ @ 30$^{th}$ Cycle (Ohm) | Resistance increase rate (%) |
| --- | --- | --- | --- |
| Example 1 | 14.3 | 19.7 | 138% |
| Example 2 | 14.1 | 23.0 | 163% |
| Example 3 | 14.5 | 22.9 | 153% |
| Comparative Example 1 | 23.0 | 103.5 | 450% |
| Comparative Example 2 | 14.0 | 27.3 | 195% |
| Comparative Example 3 | 19.0 | 64.2 | 338% |

Figure 2:
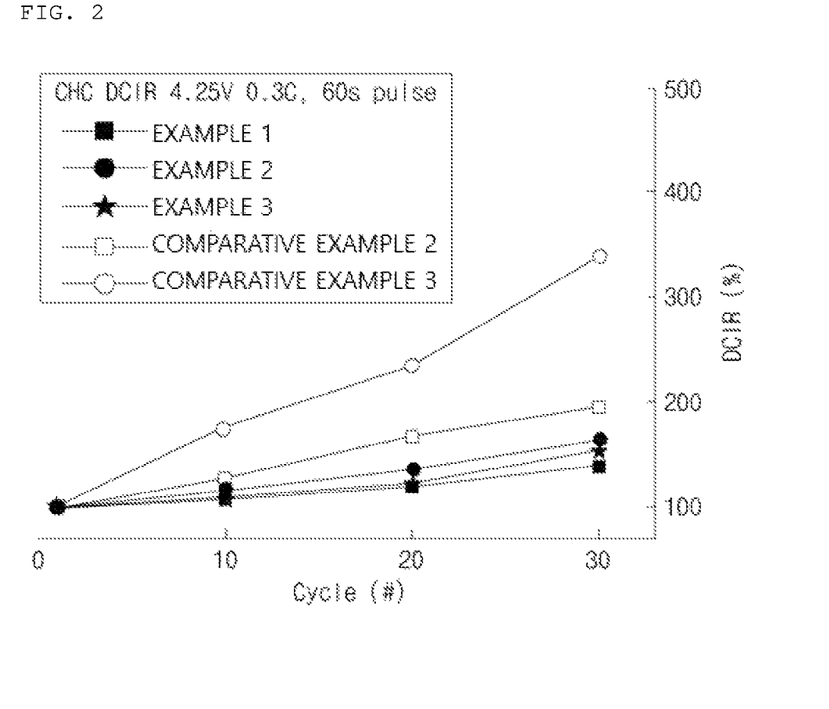
FIG. 2 is a graph showing the measured resistance according to charge/discharge cycles of a lithium secondary battery according to each of Examples 1 to 3, Comparative Example 2, and Comparative Example 3.

Referring to Table 3 and FIG. 2, it can be seen that the lithium secondary batteries of Examples do not have a high degree of resistance increase due to cycle repetition, and thus, have excellent output properties compared to the lithium secondary batteries of Comparative Examples.

The invention claimed is:

1. A method for manufacturing a positive electrode for a secondary battery, the method comprising:
   forming a positive electrode mixture layer including a positive electrode active material on a positive electrode current collector; and
   forming a metal oxide coating layer on the positive electrode mixture layer by atomic layer deposition,
   wherein the positive electrode active material includes lithium composite transition metal oxide particles and a boron-containing coating layer formed on the lithium composite transition metal oxide particles, and the lithium composite transition metal oxide particles include nickel (Ni), cobalt (Co), and manganese (Mn), wherein the nickel (Ni) is 60 mol % or greater of all metals excluding lithium,
   wherein the positive electrode mixture layer is manufactured by applying a composition for forming the positive electrode mixture layer which includes the positive electrode active material on a positive electrode current collector, followed by drying and roll-pressing, and
   wherein the thickness of the metal oxide coating layer is 2 nm to 30 nm.

2. The method of claim 1, wherein the lithium composite transition metal oxide particles contain 80 mol % or greater of the nickel (Ni) of all metals excluding lithium.

3. The method of claim 1, wherein the metal oxide coating layer comprises at least one selected from the group consisting of $Al_2O_3$, BaO, $TiO_2$, and MnO.

4. The method of claim 1, wherein the atomic layer deposition performs at least one cycle comprised of the following steps:
   positioning the positive electrode mixture layer in a chamber;
   adding a metal precursor into the chamber;
   adding a purge gas into the chamber;
   adding an oxidization agent on the positive electrode mixture layer to form a metal oxide coating layer; and
   adding a purge gas into the chamber to remove an unreacted residual oxidization agent.

5. The method of claim 4, wherein the atomic layer deposition performs the cycle 1 to 5 times.

6. The method of claim 4, wherein the atomic layer deposition is performed at 80° C. to 150° C.

7. The method of claim 1, wherein the boron-containing coating layer is included in an amount of 0.05 wt % to 0.2 wt % based on the total weight of the positive electrode active material.

8. A positive electrode for a secondary battery, comprising:
   a positive electrode current collector;
   a positive electrode mixture layer formed on the positive electrode current collector and including a positive electrode active material; and
   a metal oxide coating layer formed on the positive electrode mixture layer, wherein the positive electrode active material includes lithium composite transition metal oxide particles and a boron-containing coating layer formed on the lithium composite transition metal oxide particles, and the lithium composite transition metal oxide particles include nickel (Ni), cobalt (Co), and manganese (Mn), wherein the nickel (Ni) is 60 mol % or greater of all metals excluding lithium, and the thickness of the metal oxide coating layer is 2 nm to 30 nm.

9. The positive electrode of claim 8, wherein the thickness of the metal oxide coating layer is 3 nm to 8 nm.

10. The positive electrode of claim 8, wherein the metal oxide coating layer is included in an amount of 0.01 wt % to 0.1 wt % based on the total weight of positive electrode for a secondary battery.

11. A lithium secondary battery comprising:
   a positive electrode for a secondary battery according to claim 8;
   a negative electrode positioned to face the positive electrode for a secondary battery;
   a separator interposed between the positive electrode for a secondary battery and negative electrode; and
   an electrolyte;
   a positive electrode for a secondary battery according to claim 8;
   a negative electrode positioned to face the positive electrode for a secondary battery;
   a separator interposed between the positive electrode for a secondary battery and negative electrode; and
   an electrolyte.

* * * * *